United States Patent [19]

Levintov et al.

[11] 4,405,074
[45] Sep. 20, 1983

[54] COMPOSITE BONDING TOOL AND METHOD OF MAKING SAME

[75] Inventors: Chaim Levintov, Hofit; Michael Shienfeld, Herzeliah, both of Israel

[73] Assignee: Kulicke and Soffa Industries Inc., Horsham, Pa.

[21] Appl. No.: 297,867

[22] Filed: Aug. 31, 1981

[51] Int. Cl.³ ............. B23K 1/00; B23K 5/00; B23K 20/14; B23P 9/00
[52] U.S. Cl. ................. 228/41; 419/28; 29/445; 29/447
[58] Field of Search ........... 29/420.5, 447, 445; 75/206, 214; 228/41, 44.1 A; 219/121 LK, 121 LL, 121 LN

[56] References Cited

U.S. PATENT DOCUMENTS

| 1,733,594 | 10/1929 | Greer et al. | 29/447 X |
| 3,358,897 | 12/1967 | Christensen | 228/41 |
| 3,474,219 | 10/1969 | Steigerwald et al. | 219/121 LL X |
| 3,576,965 | 5/1971 | Gugger | 219/121 LL X |
| 3,892,114 | 7/1975 | Taniguchi et al. | 29/447 X |
| 3,962,558 | 6/1976 | Kocher et al. | 219/121 LL |
| 4,115,911 | 9/1978 | Poole et al. | 29/445 X |
| 4,270,380 | 6/1981 | Gulati et al. | 29/447 X |

FOREIGN PATENT DOCUMENTS 825395 12/1959 United Kingdom ............... 29/447

Primary Examiner—Charlie T. Moon
Attorney, Agent, or Firm—John B. Sowell

[57] ABSTRACT

A method of making a bonding tool from two different materials is provided. A bonding nib partially made from hard jewel-like material and a bonding nib holder is partially made from a larger and tougher material. The two partially made elements are joined by shrink fitting the nib holder onto the bonding nib to provide an unfinished bonding tool. The unfinished composite bonding tool is finished by grinding and polishing exterior surfaces of the bonding nib.

15 Claims, 4 Drawing Figures

COMPOSITE BONDING TOOL AND METHOD OF MAKING SAME

BACKGROUND OF THE INVENTION

1. Field of the Invention

This invention relates to bonding tools for bonding fine wires to make connections between electrodes and/or pads on semiconductor devices. More specifically the present invention relates to a method of making a composite or two-piece bonding tool.

2. Description of the Prior Art

Composite bonding tools are well known in the semiconductor art. U.S. Pat. No. 3,358,897, classified in class 228 subclass 41, shows a carbide bonding nib which has been press fitted into a magnetic steel holder which is adapted to be held or carried by a heated magnetic holder.

Micro Swiss Bonding Tool products, made by Kulicke and Soffa Industries, Inc. of Horsham, Pa. include numerous two piece or composite bonding tools, the most common of which include carbide nibs press fitted into steel holders and ceramic nibs press fitted into steel holders.

Further, numerous manufacturers throughout the world make and sell capillary bonding tools completely made of ceramic powder. There are two general methods of making all ceramic capillary bonding tools. The first is to pill press a preform shape blank approximately the shape of the desired tool and then sinter the blank. This method requires finishing all outside surfaces plus the bore and working face of the blank. The second method is similar to the first but includes injection moulding a ceramic powder into heated moulds to form a moulded ceramic blank which is set by heat and then sintered and finished.

Some prior art bonding tools, such as pure tungsten nibs are made from tungsten powder, by forming the blank on a mandrel. The mandrel is removed only after the tool blank or nib is sintered or partially sintered. Powder carbide nibs have been made by employing the aforementioned pill pressing techniques to make a blank or nib which is then sintered. Carbide tools employ binders.

It is well known that ceramic bonding tools do not require a binder, however, tungsten carbide and titanium carbide bonding tools employ a binder or binders to strengthen and hold the carbide particles together.

Synthetic ruby and sapphire are mono crystal aluminum oxide which have a Moh hardness of nine. Recently, bonding tools made completely of grown or drawn synthetic jewel material have been made commercially available. While all jewel bonding tools are very hard and have good working face wear characteristics, the long holder or shank portion is brittle like glass and requires expensive precise machining operations to form the feed hole and the bore as well as the outer shank and working face surfaces.

It would be desirable to make a composite bonding tool having a very tough material for a shank or holder portion and provide a synthetic ruby working face. It would be extremely desirable to make such a composite bonding tool by a series of precise steps which provided all the desirable features of prior art bonding tools and which cost less than synthetic jewel tools known heretofore.

SUMMARY OF THE INVENTION

It is a general object of the present invention to provide an improved method of making a two piece composite bonding tool.

It is another general object of the present invention to provide a two piece bonding tool having a tough shank or holder portion and a mono crystal synthetic jewel bonding nib mounted therein.

It is a primary object of the present invention to provide a two piece composite bonding tool which is cheaper and simpler to make than a bonding tool made entirely of synthetic jewel material.

It is yet another object of the present invention to provide a two piece composite bonding tool which is less prone to breakage under severe use.

It is another general object of the present invention to provide a series of steps employed to make a high precision bonding tool which are capable of being performed by automatic machines.

According to these and other objects of the present invention there is provided a method of making a two piece composite bonding tool. The bonding nib is partially finished from a blank cylinder of synthetic jewel material in one continuous operation. In a separate series of operations the nib holder is provided with a large cylindrical recess to receive the bonding nib and is provided with a connecting feed hole. The unfinished bonding nib is placed into the large recess which receives it loosely and the nib holder is then shrunk to provide a shrink fit between the bonding nib and the nib holder. The outside of the unfinished bonding tool is finished and the last operational step includes finishing the working face of the bonding tool by grinding and polishing.

DESCRIPTION OF THE PREFERRED EMBODIMENT

Figure 1:
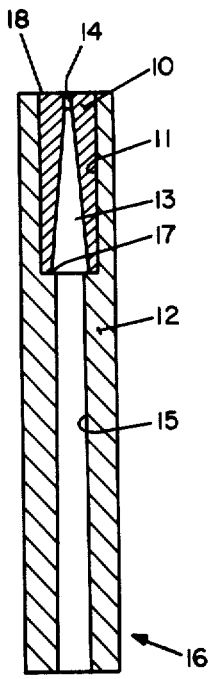
FIG. 1 is a section in elevation of an unfinished bonding tool of the present invention before grinding.
Figure 2:
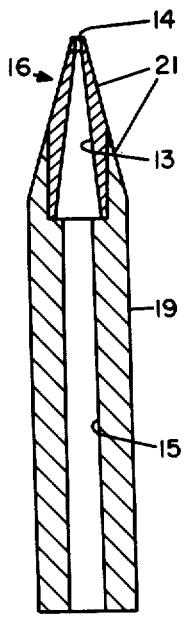
FIG. 2 is a section in elevation of the unfinished bonding tool of FIG. 1 after outside grinding.

FIG. 1 shows an unfinished bonding nib 10 mounted in the large cylindrical recess 11 of nib holder 12. Bonding nib 10 is made of a synthetic mono (single) crystal jewel material such as synthetic sapphire or synthetic ruby which has a moh hardness of nine. Such jewel material has a low coefficient of thermal expansion and is brittle. An elongated rod of such material will break relatively easy under bending stress forces. When elongated bonding tools having the shape of the tools shown in FIGS. 1 and 2 are made entirely of ruby or sapphire material they can easily be broken in handling or in use.

Bonding nib 10 was made from a solid cylindrical blank the same size as nib 10. The blank is end cut and ground on the outside diameter to plus or minus one-half of one thousandth of an inch. The blank is mounted on a precision table having circular ($\theta$), and linear (X) and (Y) notions. The cone 13 is laser cut by vaporizing jewel material. The bore 14 is also cut with a laser leaving a funnel shape in the interior of the unfinished nib 10. This operation is capable of being programmed into a computer controlled precision table which has provision for mounting the laser at the cone angle. The bore 14 diameter is controlled by the amount of offset of the laster beam when nib 10 is rotated. No further operations are required on the bonding nib 10 until it is to be finished.

Nib holder 12 is preferably made of sintered alumina which is pure aluminum oxide ($Al_2O_3$), however, the nib holder 12 can be made of metal such as stainless steel. Metal nib holders 12 can be made on automatic Swiss screw machines and do not require a detailed explanation of these known operations.

Preferably nib holder 12 is made of alumina. There are two ways to mold nib holder 12. One accepted way is to injection mold pure powdered alumina into hot dies to make the desired shape holder 12. This is not a preferred method. The preferred method of making holder 12 is to add a small amount of lubricating agent, such as about five percent paraffin wax to the alumina powder. The powder is then formed in dies employing an automatic pill press. This permits the alumina to be highly compressed into a high density non-porous nib holder. The highly compressed alumina does not require a binder and the wax serves as a lubricating agent to assure proper release from the dies without damage. This permits the large recess 11 to be made cylindrical and the smaller connecting cylindrical recess 15 may be tapered. The small end of tapered cylindrical recess 15 terminates into the large cone 13 of nib 10. The recess 15 is employed as the feed or fit hole to guide a fine bonding wire (not shown) through the bonding tool 16. The difficulty in making the nib holder 12 can be appreciated when it is understood that bore 14 is approximately 0.002 inches in diameter and the outside diameter of nib 10 is approximately 0.04 inches in diameter.

The nib holder 12 after being pill pressed formed is placed in an oven or furnace and brought up to about 600° C. to evaporate and vaporize the paraffin lubricant. Preferably the nib holder is then placed in a separate clean atmosphere furnace where it is heated to 1200° C. where a small amount of controlled shrinkage occurs. When properly heated at about 1200° C. the nib holder will become half sintered or half hard and shrink about five percent.

At this stage in the process the nib 10 may be placed in the loose recess 11 which provides a bottom stop or shoulder 17. Preferably the outer end 18 of nib 10 is completely flush with the end of nib holder 12.

After the nib 10 is securely seated in the loose recess 11 it is again fired in a furnace to full sinter the alumina at approximately 1600° C. This causes the alumina to shrink further to as much as seventeen percent and results in a shrink fit between the nib 10 and the recess 11. The unfinished tool is shown in FIG. 1 as it would appear after sintering.

The operation steps of making the unfinished bonding tool 16 shown in FIG. 1 resulted in a shrink fit between nib 10 and recess 11 which does not damage nib 10 or holder 12. When the nib holder 12 is made of steel, attempts to press fit nib 10 into nib holder 12 can easily damage the nib 10 or fail to seat the nib 10 in the recess 11. To avoid this problem, the recess end of a metal nib holder 12 is heated to expand the recess 11 and permit the nib 10 to be loosely placed in recess 11. The positive coefficient of thermal expansion of a metal nib holder 12 is greater than that of the jewel nib 10, thus, the nib holder can be expanded by heating. A directed flame or induction heating of nib holder 12 may be employed for this step.

A ceramic nib holder 12 or a steel holder 12 after receiving a nib 10 does not have a desired final outside diameter. The outer cylindrical surface 19 is centerless ground to the desired diameter and surface finish. The feed or fit hole 15 is not refinished. The bore 14 of nib 10 may be polished, however, the cone 13 does not require refinishing.

The outer cone surface 21 is made by grinding both the nib 10 and nib holder 12. No further refinishing of surface 21 is required.

Figure 3:
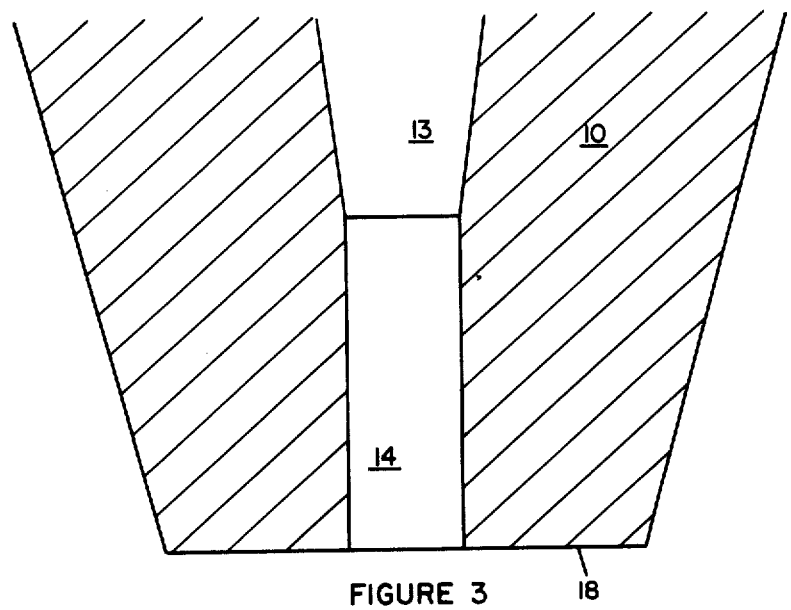
FIG. 3 is an enlarged section in elevation of the working end of the bonding nib of FIG. 2 before the working face is made by polishing and grinding.
Figure 4:
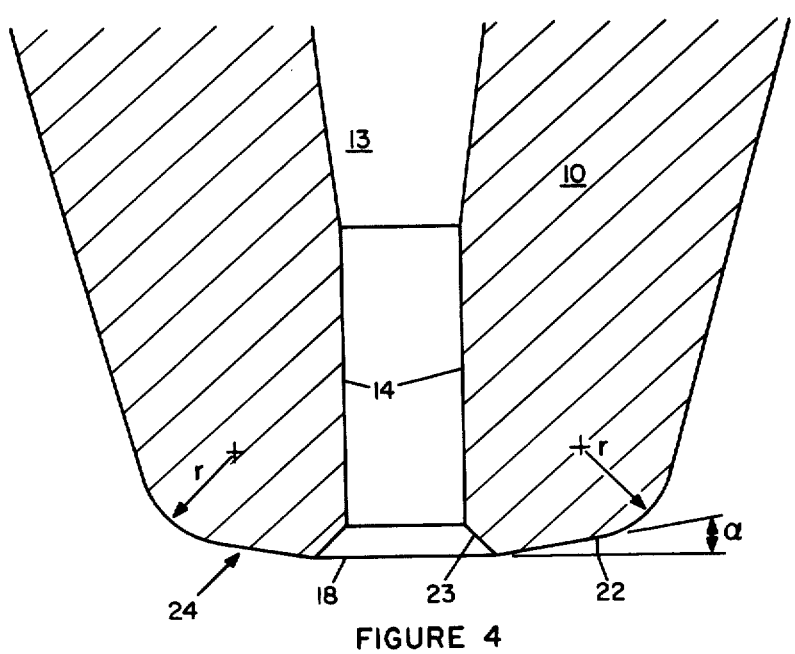
FIG. 4 is an enlarged section in elevation of the working face of the finished bonding tool.

Refer now to FIG. 3 showing the enlarged working end 18 of the unfinished bonding tool 16 of FIG. 2. This unfinished bonding tool 16 can now be finished by grinding and polishing the working end 18 or nib 10 as shown in FIG. 4. FIGS. 3 and 4 are in effect the before and after profiles of the working face of the preferred embodiment tool shown enlarged between 100 and 200 times. The finishing operations are the same whether a steel or ceramic holder 12 is employed.

After the outer cone 21 is ground with a diamond wheel, the face angle 22 of the working face of the nib 10 is made by grinding with a diamond wheel. The angle "$\alpha$" is only zero to several degrees and may be varied in a range of 0–15 degrees for optimum bonding results.

After providing face angle 22, an outer radius r is made by rotating the nib 10 and grinding and/or honing the outer radius "r".

Next the inner chamfer 23 is made by rotating the nib 10 and pressing a formed mandrel into the bore 14. Preferably the nib 10 is rotated and a steel mandrel (not shown) is inserted in the bore 14. A diamond grinding and polishing paste is employed to cut inner chamfer 23.

As a final operation the now formed working face 24 may be polished by pressing the rotating working face 24 against a resilient pad such as wood employing diamond dust as the polishing agent.

If bore 14 has not been previously polished it may be polished during inspection and cleaning. The cleaned bonding tools are then packaged in dust proof individual containers.

Having explained the operational step for manufacturing a bonding nib 10 by laser cutting the inner funnel 13, 14 and finishing the working face 24 after the nib 10 is mounted in a nib holder it will be appreciated that the machining step on the nib can be accomplished accurately with the assistance of automatic tools. Since the finished surfaces on the nibs are too small to be observed by the human eye, a T.V. camera and monitor can be employed to observe that the machining operations are being properly conducted and that excess grinding and polishing do not take place.

The bonding nib 10 is preferably held in a ceramic nib holder 12 which has approximately the same coefficient of thermal expansion as the nib holder. The preferred ceramic nib holder 12 has a relatively low tensile strength and press fitting the nib 10 into a ceramic holder 12 could easily cause breakage. Heating an already sintered nib holder would not provide adequate expansion of recess 11 to result in the desired shrink fit. Accordingly, it will be appreciated that the series of steps chosen to make the present invention substantially eliminate breakage during manufacture but also result in a bonding tool which is easily made tougher and cheaper. If required the nib holder 12 can be made large enough to withstand the stress and environmental force to which it will be subjected to without increasing the cost of manufacture of the tool enough to merit an increase in prices.

We claim:

1. The method of making a composite two piece bonding tool of the type comprising a bonding nib carried by a nib holder, the steps comprising:
   providing a cylindrical shaped mono crystal synthetic jewel workpiece,
   laser cutting a funnel shape into said synthetic jewel workpiece to provide an unfinished bonding nib,
   providing a cylindrical nib holder, said nib holder having a cylindrical recesses in one end and a connecting larger cylindrical recess in the other end adapted to receive said unfinished bonding nib,
   placing said unfinished bonding nib in said larger cylindrical recess of said nib holder to provide an unfinished composite bonding tool,
   shrinking said nib holder to provide a shrink fit between said bonding nib and said nib holder,
   grinding the outside diameter of said nib holder,
   grinding an external cone shape onto the working end of said unfinished composite bonding tool, and
   finishing the working face of said bonding nib by grinding and polishing.

2. The method as set forth in claim 1 wherein the step of shrinking said nib holder further comprises the step of expanding said larger cylindrical recess to permit placing said unfinished bonding nib in said larger cylindrical recess.

3. The method as set forth in claim 2 wherein the step of expanding said larger cylindrical recess comprises heating a positive coefficient of expansion nib holder to expand said larger cylindrical recess and cooling said unfinished composite bonding tool to provide said shrink fit between said bonding nib and said nib holder.

4. The method as set forth in claim 1 wherein the steps of shrinking said nib holder and placing said bonding nib in said nib holder comprise providing a loose fit therebetween and firing said unfinished composite bonding tool to sinter and shrink said nib holder on said bonding nib.

5. The method of making a composite two piece bonding tool of the type comprising a bonding nib carried by a nib holder, the steps comprising:
   providing a cylindrical shaped synthetic jewel nib,
   laser cutting a funnel shape into the center of said jewel nib,
   pressing ceramic powder into the shape of a nib holder, said nib holder having a cylindrical outside diameter and two distinct connecting cylindrical inside diameter shapes, the larger one of said inside diameter cylinders being adapted to loosely receive said jewel nib,
   firing said pressed ceramic holder to provide a half sintered holder with controlled shrinkage,
   placing said jewel nib in said larger inside cylindrical shape of said holder to provide an unfinished composite bonding tool,
   firing said unfinished composite bonding tool to provide a fully sintered nib holder which is shrunk onto said jewel nib,
   grinding the outside diameter of said ceramic holder,
   grinding an external cone shape onto said ceramic nib holder and said jewel nib, and
   finishing the working face of said jewel nib by grinding and polishing.

6. The method as set forth in claim 5 which further includes adding a wax additive to said ceramic powder prior to pressing said nib holder.

7. The method as set forth in claim 6 which further includes firing said pressed ceramic nib holder to vaporize said wax additive prior to sintering said nib holder.

8. The method as set forth in claim 7 wherein said wax additive is fired at approximately 600° C.

9. The method as set forth in claim 6 wherein said pressed ceramic holder is half sintered at approximately 1200° C.

10. The method as set forth in claim 7 wherein said unfinished composite bonding tool is fully sintered at approximately 1600° C.

11. The method as set forth in claim 5 wherein the step of finishing the working face of the bonding nib of said bonding tool comprises grinding a working face angle on the exposed end of said jewel nib.

12. The method as set forth in claim 11 which further comprises the step of grinding an outside radius on the working face of said jewel nib.

13. The method as set forth in claim 12 which further comprises the step of polishing a chamfer recess around the bore of said jewel nib.

14. The method as set forth in claim 13 which further comprises the step of polishing the working face of said jewel nib with a resilient pad and diamond paste.

15. A composite two piece bonding tool comprising:
   a sintered high density alumina nib holder,
   said nib holder having a tapered fit hole in one end and a large connecting recess in the other end,
   a synthetic jewel mono crystal bonding nib mounted in said large connecting recess in said nib holder,
   said bonding nib being held in said recess by a shrink fit between said bonding nib and said nib holder,
   said bonding nib having a funnel shape extending through the bonding nib and terminating in a substantially constant diameter bore at the working face of said bonding tool, and
   said funnel shape being characterized by a smooth finish surface made by cutting said funnel shape with a laser beam.

* * * * *